United States Patent
Kim et al.

(10) Patent No.: US 8,058,662 B2
(45) Date of Patent: Nov. 15, 2011

(54) LIGHT EMITTING DIODE AND METHOD OF FABRICATING THE SAME

(75) Inventors: Do Hyung Kim, Ansan-si (KR);
Chung-Hoon Lee, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 206 days.

(21) Appl. No.: 11/994,813

(22) PCT Filed: Nov. 9, 2005

(86) PCT No.: PCT/KR2005/003784
§ 371 (c)(1),
(2), (4) Date: Jan. 4, 2008

(87) PCT Pub. No.: WO2007/004775
PCT Pub. Date: Jan. 11, 2007

(65) Prior Publication Data
US 2008/0217637 A1    Sep. 11, 2008

(30) Foreign Application Priority Data

Jul. 4, 2005 (KR) .................. 10-2005-0059736

(51) Int. Cl.
*H01L 33/00* (2010.01)
*H01L 21/50* (2006.01)
(52) U.S. Cl. ............... 257/98; 257/79; 438/26
(58) Field of Classification Search .......... 257/79, 257/98, 99, 100; 438/22, 26, 29, 39, 42, 438/E33.055
See application file for complete search history.

(56) References Cited

U.S. PATENT DOCUMENTS

| | | | | |
|---|---|---|---|---|
| 5,813,753 A  * |  9/1998 | Vriens et al. | ..................... | 257/98 |
| 5,949,655 A  * |  9/1999 | Glenn | ........................... | 361/783 |
| 6,610,563 B1 * |  8/2003 | Waitl et al. | ..................... | 438/166 |
| 6,627,814 B1 * |  9/2003 | Stark | .............................. | 174/539 |
| 6,650,044 B1 * | 11/2003 | Lowery | .......................... | 313/502 |
| 6,835,960 B2 * | 12/2004 | Lin et al. | ........................ | 257/100 |
| 7,714,342 B2 * |  5/2010 | Lee et al. | ........................ | 257/98 |

(Continued)

FOREIGN PATENT DOCUMENTS

| | | |
|---|---|---|
| EP | 1198016 | 4/2002 |
| EP | 1 408 559 | 4/2004 |
| JP | 2000-208822 | 7/2000 |
| JP | 2001-308393 | 11/2001 |
| JP | 2004253745 | 9/2004 |

(Continued)

OTHER PUBLICATIONS

European Search Report dated Dec. 17, 2010 in corresponding appl. EP 05 82 0596.

*Primary Examiner* — Leonardo Andujar
*Assistant Examiner* — Jordan Klein
(74) *Attorney, Agent, or Firm* — H.C. Park & Associates, PLC

(57) ABSTRACT

The present invention relates to a light emitting diode and a method of fabricating the same, wherein the distance between a fluorescent substance and a light emitting diode chip is uniformly maintained to enhance luminous efficiency. To this end, there is provided a light emitting diode comprising at least one light emitting diode chip, lead terminals for use in applying electric power to the light emitting diode chip, and a frame that is used for mounting the light emitting diode chip thereon and is formed to have a predetermined height and a shape corresponding to that of the light emitting diode chip.

20 Claims, 9 Drawing Sheets

U.S. PATENT DOCUMENTS

| | | | |
|---|---|---|---|
| 2001/0050371 A1* | 12/2001 | Odaki et al. | 257/98 |
| 2004/0051111 A1* | 3/2004 | Ota et al. | 257/98 |
| 2004/0263073 A1* | 12/2004 | Baroky et al. | 313/512 |
| 2005/0056858 A1* | 3/2005 | Kakiuchi et al. | 257/100 |
| 2005/0133808 A1* | 6/2005 | Uraya et al. | 257/99 |
| 2005/0219835 A1* | 10/2005 | Nagayama | 362/84 |
| 2006/0170332 A1* | 8/2006 | Tamaki et al. | 313/498 |
| 2006/0220050 A1* | 10/2006 | Higaki et al. | 257/99 |

FOREIGN PATENT DOCUMENTS

| | | |
|---|---|---|
| JP | 2004-363343 | 12/2004 |
| JP | 2005019997 | 1/2005 |
| JP | 2005-057265 | 3/2005 |
| JP | 2005091675 | 4/2005 |
| JP | 2008-521210 | 6/2008 |
| WO | 2006/054616 | 5/2006 |

* cited by examiner

LIGHT EMITTING DIODE AND METHOD OF FABRICATING THE SAME

TECHNICAL FIELD

The present invention relates to a light emitting diode and a method of fabricating the same, and more particularly, to a light emitting diode with a frame structure for allowing uniform application of a fluorescent substance thereon and a method of fabricating the light emitting diode.

BACKGROUND ART

FIGS. 1 and 2 are schematic sectional views of light emitting diodes in which a fluorescent substance is applied in accordance with a prior art. FIG. 1 is a sectional view of a conventional top-type light emitting diode and FIG. 2 is a sectional view of a conventional lamp-type light emitting diode.

Referring to FIG. 1, the light emitting diode comprises a substrate 10 with first and second lead terminals 30 and 35 formed thereon, a light emitting diode chip 20 mounted on the substrate 10, and a reflecting portion 40 formed on the substrate to surround the light emitting diode chip 20. The light emitting diode chip 20 is electrically connected to the first and second lead terminals 30 and 35 through wires 70. A molding portion 60 is formed on the light emitting diode chip 20 by filling a liquid epoxy resin or the like into the reflecting portion 40 and thermally curing the resin for a predetermined time so as to protect the light emitting diode chip 20. Further, a fluorescent substance 50 for absorbing light emitted from the light emitting diode chip 20 and performing wavelength conversion of the light into respective different wavelengths is mixed in the molding portion 60.

Referring to FIG. 2, the light emitting diode comprises a first lead terminal 80 with a reflecting portion 40 at an upper end thereof and a second lead terminal 85 spaced apart by a predetermined distance from the first lead terminal 80. Further, a light emitting diode chip 20 is mounted inside the reflecting portion 40 of the first lead terminal 80, and a molding portion 60 is formed on the light emitting diode chip 20 by applying a liquid epoxy resin or the like and thermally curing the resin for a predetermined time so as to protect the light emitting diode chip 20. Further, a fluorescent substance 50 for absorbing light emitted from the light emitting diode chip 20 and performing wavelength conversion of the light into respective different wavelengths is mixed in the molding portion 60.

When the fluorescent substance is applied as described above, the fluorescent substance with a higher specific gravity precipitates due to a difference in specific gravity between the fluorescent substance and the epoxy resin with a relatively lower specific gravity during the predetermined time when the liquid epoxy resin is cured. A difference in concentration within the liquid epoxy resin occurs due to such precipitation of the fluorescent substance, and thus, there is a problem with color reproducibility because light emitted from the light emitting diode chip is not uniform. Further, since a color speckle is produced, a great amount of fluorescent substance should be contained in the molding portion to express a uniform color, resulting in degradation of light emitting efficiency. Furthermore, since the fluorescent substance is not uniformly distributed, there is a problem in that the color of light emitted from the light emitting diode varies depending on an angle at which the light emitting diode is viewed.

FIGS. 3 and 4 are schematic sectional views of light emitting diodes in which a fluorescent substance is applied in accordance with another prior art. The light emitting diodes shown in FIGS. 3 and 4 are different from those shown in FIGS. 1 and 2 in that a mixture of a fluorescent substance and a resin is dotted with a predetermined thickness to encapsulate a light emitting diode chip and a molding portion is then formed thereon. However, remaining components of the light emitting diodes shown in FIGS. 3 and 4 are identical to those of the light emitting diodes shown in FIGS. 1 and 2.

Referring to FIG. 3, in the light emitting diode, the mixture of fluorescent substance and resin is dotted on the light emitting diode chip 20, and the molding portion 65 is formed inside a reflecting portion 40. Referring to FIG. 4, the fluorescent substance 50 is injected only inside the reflecting portion 40, and a transparent epoxy resin is used for the peripheral molding portion 65 to enhance the transmissivity of light emitted from the light emitting diode chip 20.

In the case where the mixture of fluorescent substance and resin is applied as described above, the mixture may flow laterally. Thus, there is a problem in that the distance between the light emitting diode and the fluorescent substance varies and thus a color may not be uniformly expressed and two or more different colors may be produced depending on a light emitting region. Further, in case of FIG. 4, the luminous efficiency of light considerably decreases due to interference between the light emitting diode chip and the reflecting portion.

FIG. 5 is a schematic sectional view of a light emitting diode in which a fluorescent substance is applied in accordance with a further prior art. The light emitting diode of FIG. 5 further comprises a guide member 90 for preventing a mixture of fluorescent substance and resin from flowing outside a substrate or lead terminals when the mixture of fluorescent substance and resin is dotted on a light emitting diode chip. However, since an additional process should be added to attach the guide member 90, a fabricating process becomes complicated, resulting in increased production costs. Further, there is a problem in that luminous efficiency decreases and a great amount of fluorescent substance is consumed due to the guide member.

DISCLOSURE OF INVENTION

The present invention is conceived to solve the aforementioned problems in the prior arts. Accordingly, an object of the present invention is to provide a light emitting diode and a method of fabricating the same, wherein the distance between a fluorescent substance and a light emitting diode chip is uniformly maintained when the fluorescent substance is applied to the light emitting diode, thereby reducing a color variation, i.e., generation of two or more different colors, and enhancing luminous efficiency.

According to one aspect of the present invention for achieving the object, there is provided a light emitting diode, comprising at least one light emitting diode chip; lead terminals for use in applying electric power to the light emitting diode chip; and a frame that is used for mounting the light emitting diode chip thereon and is formed to have a predetermined height and a shape corresponding to that of the light emitting diode chip.

The light emitting diode may further comprise a molding portion that has a fluorescent substance for converting the wavelength of light emitted from the light emitting diode chip and is formed on the fame.

The light emitting diode may further comprise a peripheral molding portion for encapsulating the light emitting diode chip.

The molding portion may be formed to have a shape corresponding to that of the light emitting diode chip.

The frame may be formed on one of the lead terminals.

The frame and the lead terminals may be formed integrally with each other.

The light emitting diode may further comprise a substrate and the frame may be formed on the substrate.

The frame and the substrate may be formed integrally with each other.

The light emitting diode may further comprise a housing for surrounding the substrate.

A barrier with a predetermined height may be formed along the periphery of a top surface of the frame.

The barrier and the frame may be formed integrally with each other.

The frame may be formed to have a rectangular shape.

A groove with a predetermined depth may be formed along the periphery of a top surface of the frame.

According to another aspect of the present invention, there is provided a method of fabricating a light emitting diode, comprising the steps of forming a frame with a shape corresponding to that of a light emitting diode chip; mounting the light emitting diode chip on the frame; applying a predetermined amount of fluorescent substance on the frame; and heating and curing the fluorescent substance.

A barrier with a predetermined height may be formed along the periphery of a top surface of the frame.

A groove with a predetermined depth may be formed along the periphery of a top surface of the frame.

BEST MODE FOR CARRYING OUT THE INVENTION

Hereinafter, preferred embodiments of the present invention will be described in detail with reference to the accompanying drawings.

Figure 1:
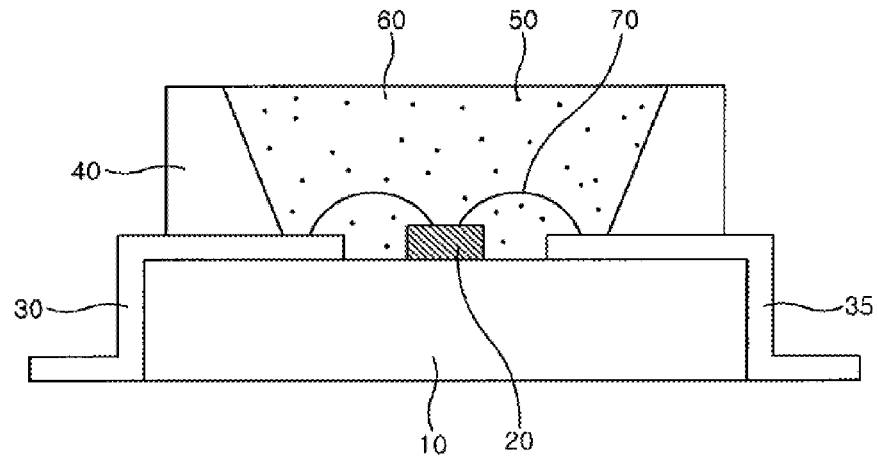
FIGS. 1 and 2 are schematic sectional views of light emitting diodes in which a fluorescent substance is applied in accordance with a prior art.
Figure 2:
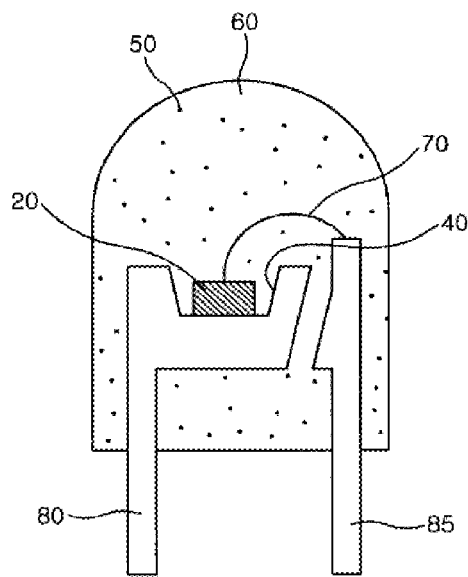
Figure 3:
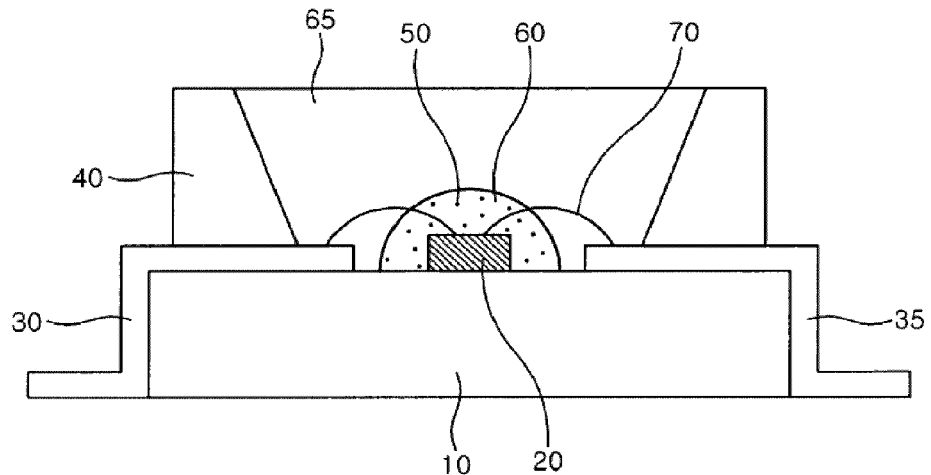
FIGS. 3 and 4 are schematic sectional views of light emitting diodes in which a fluorescent substance is applied in accordance with another prior art.
Figure 4:
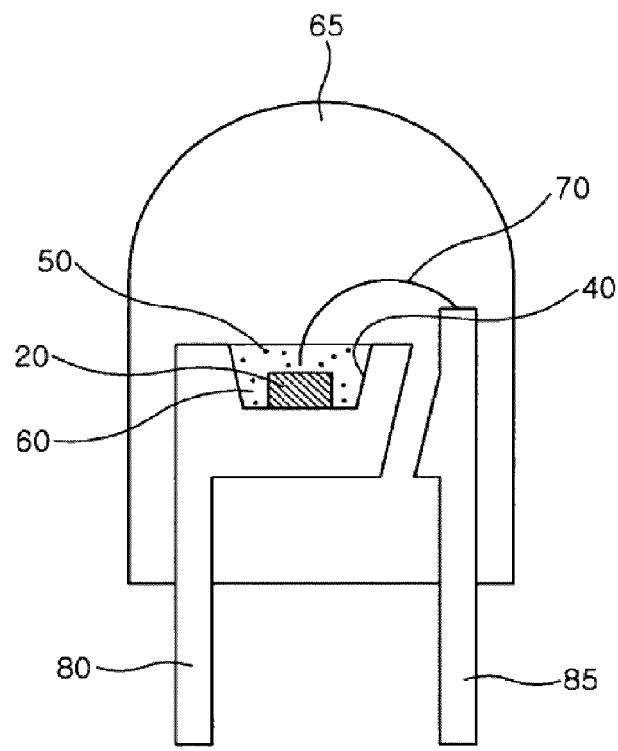
Figure 5:
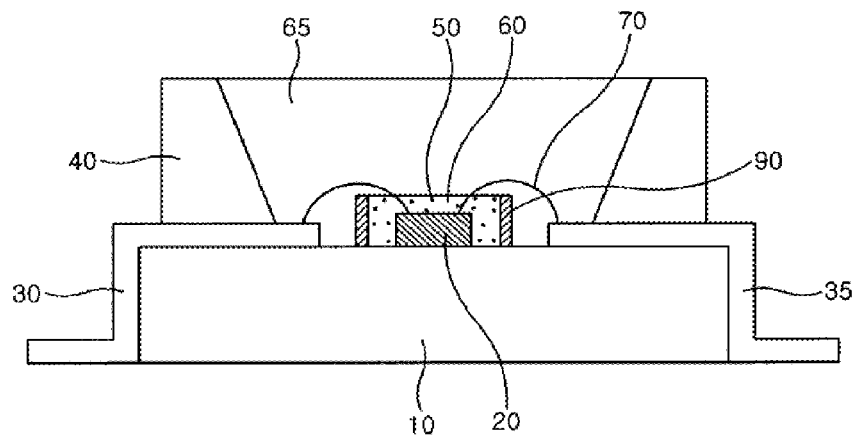
FIG. 5 is a schematic sectional view of a light emitting diode in which a fluorescent substance is applied in accordance with a further prior art.
Figure 6:
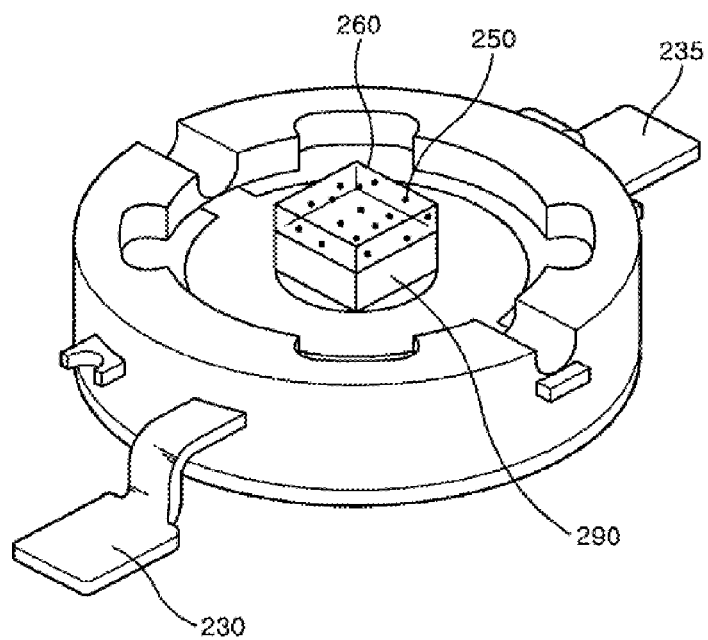
FIGS. 6 and 7 are a perspective view and a sectional view of a light emitting diode according to a first embodiment of the present invention, respectively.
Figure 7:
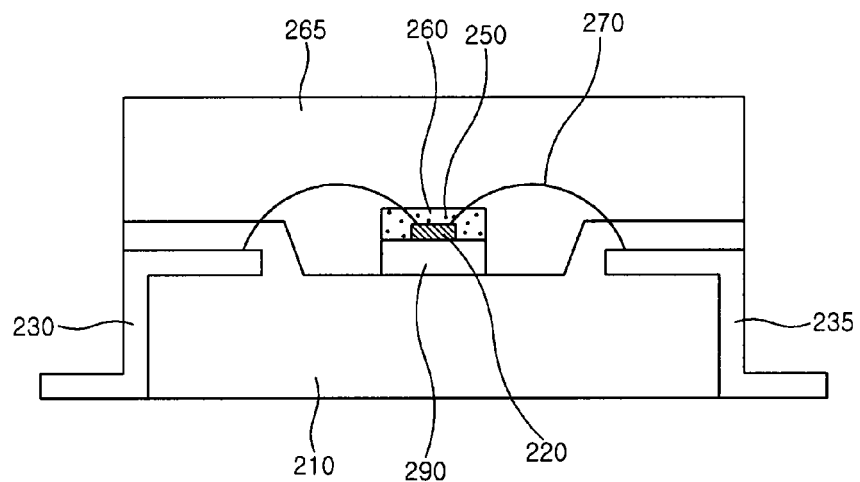

FIGS. 6 and 7 are a perspective view and a sectional view of a light emitting diode according to a first embodiment of the present invention, respectively. That is, the figures are a perspective view and a sectional view of a chip-type light emitting diode according to the present invention, respectively.

Referring to FIGS. 6 and 7, the light emitting diode comprises a substrate 210 with lead terminals 230 and 235 formed thereon, a frame 290 formed on the substrate 210, a light emitting diode chip 220 mounted on the frame 290, and wires 270 for connecting the light emitting diode chip 220 to the lead terminals 230 and 235. Further, a fluorescent substance 250 for converting the wavelength of light generated from the light emitting diode chip 220 is mixed with an encapsulant and then applied to the frame 290 to form a molding portion 260. Although the light emitting diode of this embodiment includes one light emitting diode chip 220, it is only for illustrative purposes and the light emitting diode may include a plurality of light emitting diode chips 220.

Further, a peripheral molding portion 265 is formed of a liquid epoxy resin or the like on the light emitting diode chip 220 to protect the light emitting diode chip 220. The peripheral molding portion 265 may be formed through an injection molding process using a predetermined resin, or through preparation thereof using an additional mold and subsequent pressurization or heat-treatment thereof. In this case, the peripheral molding portion 265 is formed using an epoxy resin, a silicone resin or the like. The peripheral molding portion 265 may be formed in various forms such as an optical lens or a flat plate.

Meanwhile, the frame 290 may be formed separately from the substrate 210 and then bonded thereto. Otherwise, the frame 290 and the substrate 210 may be formed integrally with each other. In this case, the substrate 210 may be formed using a metal slug or a thermally conductive resin.

Further, the encapsulant is made of a liquid epoxy resin or silicone resin.

Figure 8:
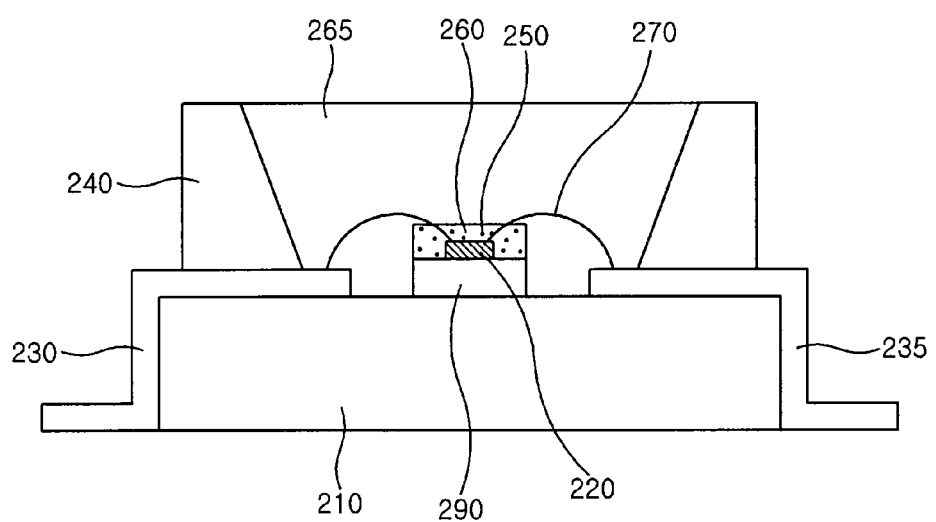
FIG. 8 is a sectional view of a light emitting diode according to a second embodiment of the present invention.

FIG. 8 is a sectional view of a light emitting diode according to a second embodiment of the present invention. That is, the figure is a schematic sectional view of a top-type light emitting diode according to the present invention.

Referring to FIG. 8, the light emitting diode of the second embodiment is similar to that of the first embodiment except that a reflecting portion is formed on a substrate. Thus, only parts different from each other will be described below.

The light emitting diode comprises a substrate 210, lead terminals 230 and 235 formed on the substrate 210, a frame 290, a reflecting portion 240, a light emitting diode chip 220 mounted on the frame 290, and wires 270 for connecting the light emitting diode chip 220 to the lead terminals 230 and 235. Further, a fluorescent substance 250 for converting the wavelength of light generated from the light emitting diode chip 220 is mixed with an encapsulant and then applied to the frame 290 to form a molding portion 260. A peripheral molding portion 265 is formed on the light emitting diode chip 220 to protect the light emitting diode chip 220. In this case, the peripheral molding portion 265 is made of a predetermined resin, preferably, an epoxy resin or silicone resin.

Meanwhile, the reflecting portion 240 is formed to surround at least one light emitting diode chip 220 on the substrate 210. At this time, to enhance the luminance and condensing efficiency of light, the reflecting portion 240 may be formed in such a manner that an inner wall of the reflecting portion 240 surrounding the light emitting diode chip 220 has a predetermined slope.

Figure 9:
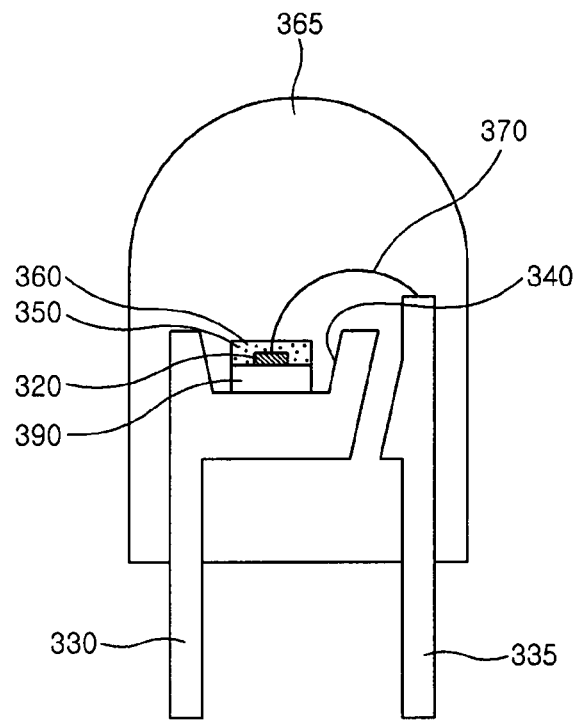
FIG. 9 is a sectional view of a light emitting diode according to a third embodiment of the present invention.

FIG. 9 is a sectional view of a light emitting diode according to a third embodiment of the present invention. That is, this figure is a schematic sectional view of a lamp-type light emitting diode according to the present invention.

Referring to FIG. 9, the light emitting diode comprises a first lead terminal 330 with a reflecting portion 340 at a top end thereof, and a second lead terminal 335 spaced apart by a predetermined distance from the first lead terminal 330. Further, a frame 390 is formed inside the reflecting portion 340 of the first lead terminal 330, and a light emitting diode chip 320 is mounted on the frame 390.

Furthermore, a fluorescent substance 350 for converting the wavelength of light generated from the light emitting diode chip 320 is mixed with an encapsulant and then applied to the frame 390 to form a molding portion 360. A peripheral molding portion 365 is formed on the light emitting diode chip 320 by applying a predetermined resin thereto and thermally curing the resin for a predetermined time so as to protect the light emitting diode chip 320. In this case, the peripheral molding portion 365 may comprise an epoxy resin or silicone resin.

Figure 10:
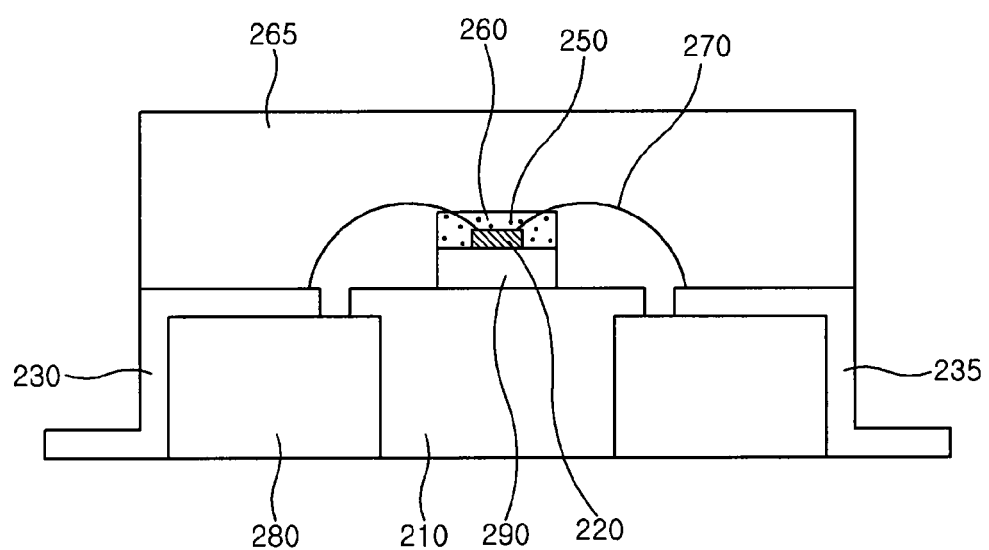
FIGS. 10 and 11 are sectional views of light emitting diodes according to fourth and fifth embodiments of the present invention, respectively.
Figure 11:
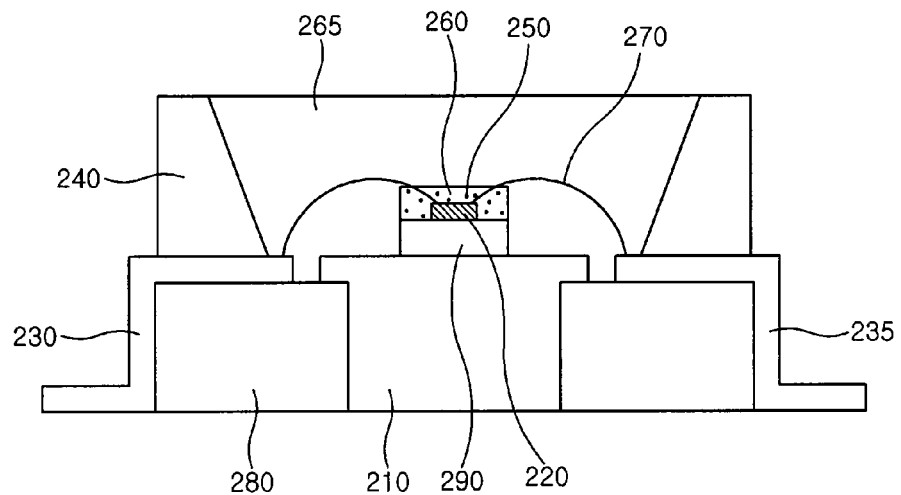

FIGS. 10 and 11 are sectional views of light emitting diodes according to fourth and fifth embodiments of the present invention. That is, the figures are schematic sectional views of light emitting diodes each of which has a housing.

The light emitting diode according to the fourth embodiment of the present invention shown in FIG. 10 is different from that of the first embodiment in that it further comprises a housing 280 for surrounding a substrate. However, remaining components thereof are identical to each other.

The light emitting diode according to the fifth embodiment of the present invention shown in FIG. 11 is different from that of the second embodiment in that it further comprises a housing 280 for surrounding a substrate. However, remaining components thereof are identical to each other.

Figure 12:
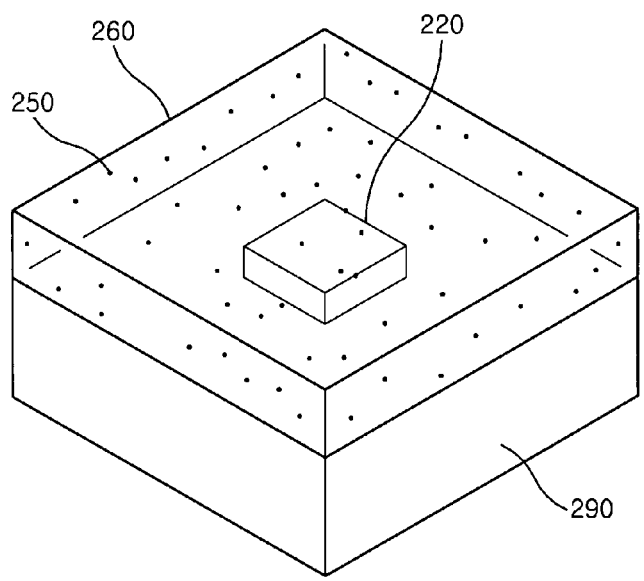
FIGS. 12 to 17 are views showing examples of a frame structure according to the present invention.
Figure 13:
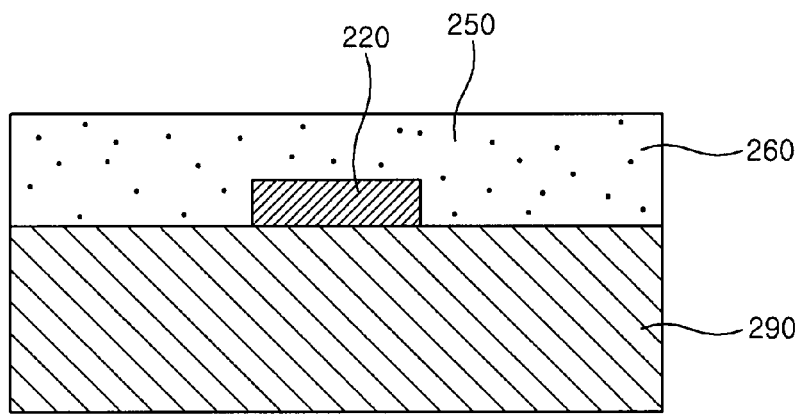
Figure 14:
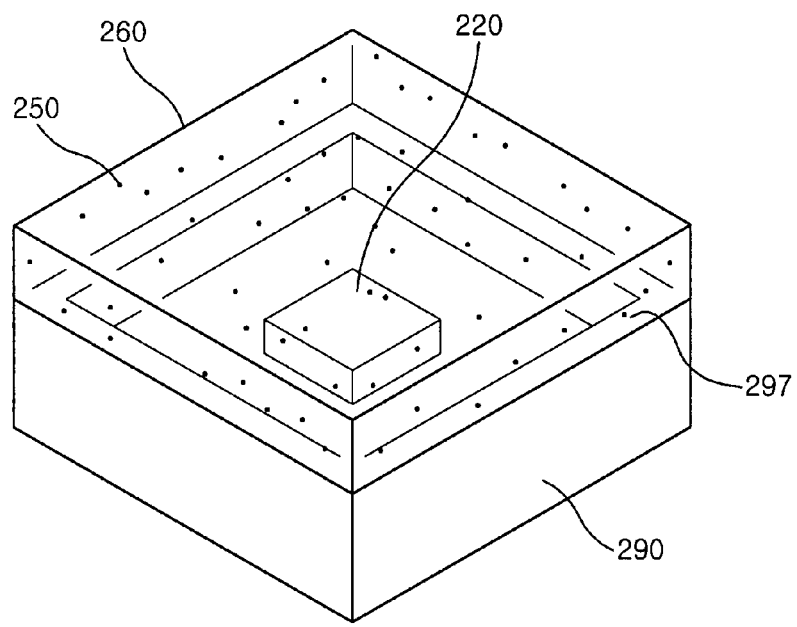
Figure 15:
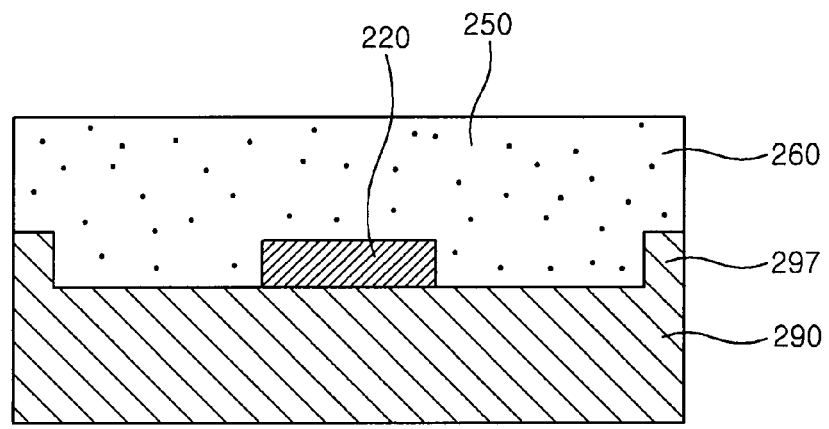
Figure 16:
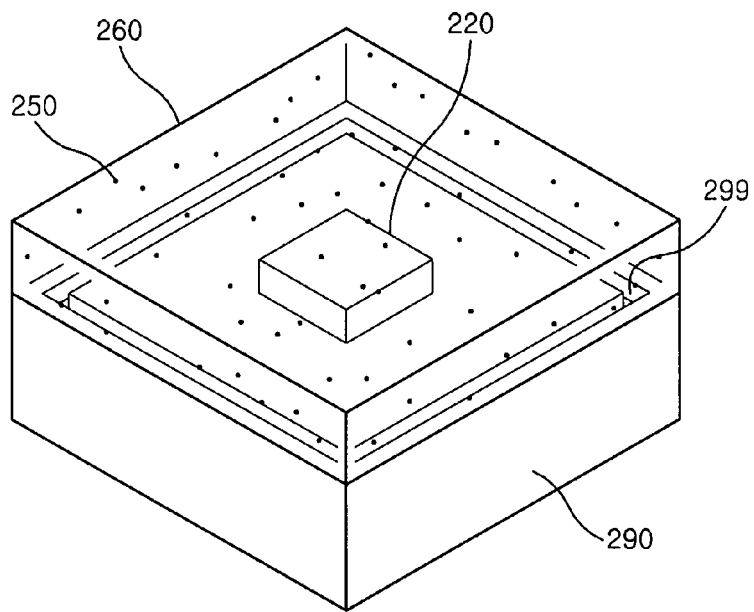
Figure 17:
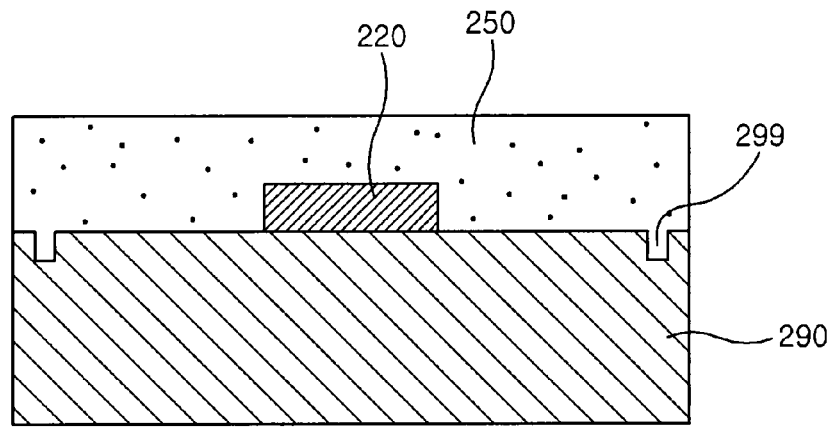

FIGS. 12 and 13 are a perspective view and a sectional view showing an example of a frame structure according to the present invention, respectively. FIGS. 14 and 15 are a perspective view and a sectional view showing another example of the frame structure according to the present invention. FIGS. 16 and 17 are a perspective view and a sectional view showing a further example of the frame structure according to the present invention.

Referring to FIGS. 12 and 13, the frame 290 is constructed in the same shape as the light emitting diode chip 220, i.e., in the form of a rectangle, to be sized about 1.5 or 2 times as large as that of the light emitting diode chip 220. Although the light emitting diode chip 220 and the frame 290 in this embodiment are constructed in the form of rectangles, they are not limited thereto but may be constructed in various forms. In this case, the frame 290 and the light emitting diode chip 220 are constructed to be in the same shape.

After a light emitting diode chip 220 is mounted on a central portion of a top surface of the frame 290 with the above mentioned shape and size, and a mixture of fluorescent substance and encapsulant is then dotted thereon, a molding portion 260 is constructed in the same shape as the frame 290. Thus, a uniform distance is established between the light emitting diode chip 220 and the molding portion 260. In other words, the molding portion 260 is constructed in the same shape of the light emitting diode chip 220.

Referring to FIGS. 14 and 15, a frame structure of this embodiment is similar to that shown in FIGS. 12 and 13 but is different therefrom only in that a barrier 297 with a predetermined height is formed along the periphery of the top surface of the frame 290.

The barrier 297 functions to lead the formation of the molding portion 260 using the mixture of fluorescent substance 250 and encapsulant such that the molding portion 260 has the same shape as the light emitting diode chip 220. At this time, the barrier 297 may be formed integrally with the frame 290.

Referring to FIGS. 16 and 17, a frame structure of this embodiment is similar to that shown in FIGS. 12 and 13 but is different therefrom only in that a groove 299 with a predetermined depth is formed along the periphery of the top surface of the frame 290.

Similarly to the barrier 297, the groove 299 functions to lead the formation of the molding portion 260 using the mixture of fluorescent substance 250 and encapsulant such that the molding portion 260 has the same shape as the light emitting diode chip 220.

Figure 18:
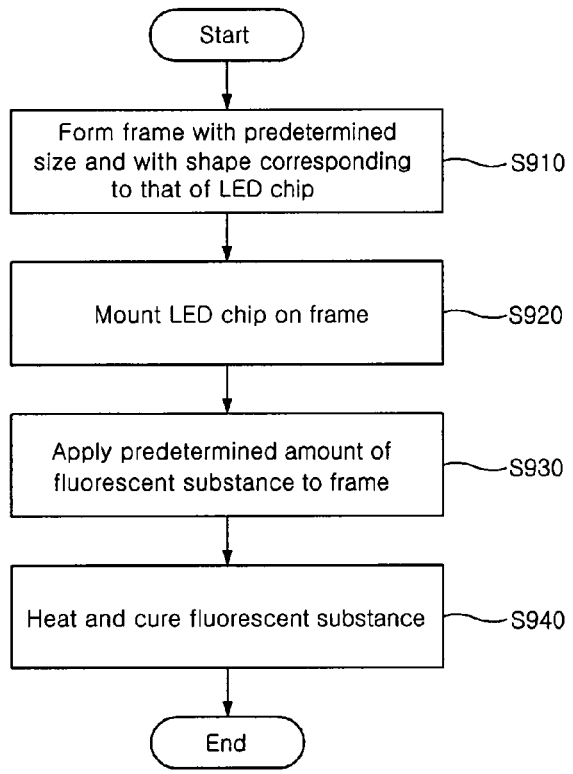
FIG. 18 is a flowchart illustrating a method of fabricating a light emitting diode according to the present invention.

FIG. 18 is a flowchart illustrating a method of fabricating a light emitting diode according to the present invention.

Referring to FIG. 18, a process of forming a frame with a predetermined size and the same shape as a light emitting diode chip is first performed (S910).

A light emitting diode chip is mounted on the frame formed in step S910 (S920).

Thereafter, a predetermined amount of fluorescent substance is applied to the frame (S930). At this time, the fluorescent substance is mixed with an encapsulant, e.g., a liquid epoxy resin or silicone resin, and then applied to the frame.

Meanwhile, although the frame is formed in the same shape as the light emitting diode chip as described above, the frame is formed to be larger than the light emitting diode chip. Further, a barrier with a predetermined height may be formed along the periphery of a top surface of the frame. Otherwise, a groove with a predetermined depth may be formed along the periphery of the top surface of the frame.

Thereafter, a process of heating and curing the fluorescent substance applied to the frame is then performed (S940).

The foregoing is merely the exemplary embodiments of the light emitting diode and the method of fabricating the same. The present invention is not limited to the embodiments. It will be readily understood by those skilled in the art that various modifications and changes can be made thereto without departing from the technical spirit and scope of the present invention defined by the appended claims. It is also apparent that the modifications and changes fall within the scope of the present invention.

INDUSTRIAL APPLICABILITY

According to the present invention described above, a light emitting diode chip is mounted on a frame with a shape corresponding to that of the light emitting diode chip and a fluorescent substance is then dotted thereon, so that a uniform distance is established between the light emitting diode chip and molding portion, thereby reducing a color variation, i.e., generation of two or more different colors, and enhancing luminous efficiency.

The invention claimed is:

1. A light emitting diode, comprising:
at least one light emitting diode chip;
lead terminals to apply electric power to the light emitting diode chip;
a frame having the light emitting diode chip mounted thereon, the frame and the light emitting diode chip having the same shape in plan view; and
a molding portion comprising a fluorescent substance for converting the wavelength of light emitted from the light emitting diode chip, the molding portion being formed on the frame, and an outer side surface of the molding portion being substantially flush with an outer side surface of the frame.

2. The light emitting diode as claimed in claim 1, further comprising a peripheral molding portion encapsulating the light emitting diode chip.

3. The light emitting diode as claimed in claim 2, wherein the molding portion and the frame each comprise a plurality of outer side surfaces contacting the peripheral molding portion, and all corresponding outer side surfaces of the molding portion and the frame are substantially flush with each other.

4. The light emitting diode as claimed in claim 1, wherein the molding portion and the light emitting diode chip have the same shape.

5. The light emitting diode as claimed in claim 1, wherein the frame is formed on one of the lead terminals.

6. The light emitting diode as claimed in claim 5, wherein the frame and the lead terminal are formed integrally with each other.

7. The light emitting diode as claimed in claim 1, further comprising a substrate, the frame being formed on the substrate.

8. The light emitting diode as claimed in claim 7, wherein the frame and the substrate are formed integrally with each other.

9. The light emitting diode as claimed in claim 7, further comprising a housing surrounding the substrate.

10. The light emitting diode as claimed in claim 1, wherein a barrier is formed along the periphery of a top surface of the frame, the barrier protruding from the top surface of the frame.

11. The light emitting diode as claimed in claim 10, wherein the barrier and the frame are formed integrally with each other.

12. The light emitting diode as claimed in claim 1, wherein a groove is formed along the periphery of a top surface of the frame.

13. The light emitting diode as claimed in claim 1, wherein the frame is formed to have a rectangular shape.

14. The light emitting diode as claimed in claim 1, wherein the fluorescent substance is disposed above the frame without extending beyond a perimeter of the frame.

15. The light emitting diode as claimed in claim 1, wherein the fluorescent substance and the molding portion are both disposed above the frame without extending beyond a perimeter of the frame.

16. The light emitting diode as claimed in claim 1, wherein the molding portion is coterminous with the frame.

17. The light emitting diode as claimed in claim 1, wherein the molding portion and the frame comprise the same shape and the same size.

18. A method of fabricating a light emitting diode, comprising:
    forming a frame;
    mounting a light emitting diode chip on the frame;
    applying a fluorescent substance on the frame; and
    heating and curing the fluorescent substance,
    wherein the frame is formed to have the same shape as the light emitting diode chip in plan view, and
    wherein an outer side surface of the fluorescent substance is formed to be substantially flush with an outer side surface of the frame.

19. The method as claimed in claim 18, wherein a barrier is formed along the periphery of a top surface of the frame, the barrier protruding from the top surface of the frame.

20. The method as claimed in claim 18, wherein a groove is formed along the periphery of a top surface of the frame.

* * * * *